(12) United States Patent
Funcell

(10) Patent No.: US 7,910,822 B1
(45) Date of Patent: Mar. 22, 2011

(54) FABRICATION PROCESS FOR PHOTOVOLTAIC CELL

(75) Inventor: Alelie Funcell, Milpitas, CA (US)

(73) Assignee: Solaria Corporation, Fremont, CA (US)

( * ) Notice: Subject to any disclaimer, the term of this patent is extended or adjusted under 35 U.S.C. 154(b) by 1412 days.

(21) Appl. No.: 11/253,182

(22) Filed: Oct. 17, 2005

(51) Int. Cl.
*H01L 31/18* (2006.01)
(52) U.S. Cl. .................................................. 136/244
(58) Field of Classification Search .............. 136/244
See application file for complete search history.

(56) References Cited

U.S. PATENT DOCUMENTS

| | | | |
|---|---|---|---|
| 2,470,618 | A | 5/1949 | Holden |
| 3,330,700 | A | 7/1967 | Sequeira et al. |
| 3,446,676 | A | 5/1969 | Goldsmith et al. |
| 3,575,721 | A | 4/1971 | Mann |
| 3,597,050 | A | 8/1971 | Plumat |
| 3,641,354 | A | 2/1972 | De Ment |
| 3,700,714 | A | 10/1972 | Hamilton et al. |
| 3,819,417 | A | 6/1974 | Haynos |
| 3,849,880 | A | 11/1974 | Haynos |
| 3,874,931 | A | 4/1975 | Haynos |
| 3,951,633 | A | 4/1976 | Danihel |
| 3,993,505 | A | 11/1976 | Pack |
| 3,999,283 | A | 12/1976 | Dean et al. |
| 4,029,519 | A | 6/1977 | Schertz et al. |
| 4,056,405 | A | 11/1977 | Varandi |
| 4,091,798 | A | 5/1978 | Selcuk |
| 4,097,308 | A | 6/1978 | Klein et al. |
| 4,106,952 | A | 8/1978 | Kravitz |
| 4,118,249 | A | 10/1978 | Graven et al. |
| 4,122,833 | A | 10/1978 | Selcuk |
| 4,143,234 | A | 3/1979 | Johnson et al. |
| 4,166,917 | A | 9/1979 | Dorfeld et al. |
| 4,170,507 | A | 10/1979 | Keeling et al. |
| 4,174,978 | A | 11/1979 | Lidorenko et al. |
| 4,193,820 | A | 3/1980 | Thomas |
| 4,203,646 | A | 5/1980 | Desso |
| 4,239,555 | A | 12/1980 | Scharlack et al. |
| 4,257,821 | A | 3/1981 | Kelly et al. |
| 4,291,191 | A | 9/1981 | Dahlberg |

(Continued)

FOREIGN PATENT DOCUMENTS

AU 743826 B2 2/2002

(Continued)

OTHER PUBLICATIONS

Boedeker Plastics, Inc.: Acrylic Polymethyl-MethAcrylate PMMA datasheet, http://www.boedeker.com/acryl.html; May 7, 1999; pp. 1-2.

(Continued)

*Primary Examiner* — Arun S Phasge
(74) *Attorney, Agent, or Firm* — Richard T. Ogawa; Ogawa P.C.

(57) ABSTRACT

A photovoltaic strip is physically separated from a semiconductor wafer utilizing physical sawing or other techniques. In accordance with one embodiment, a type of semiconductor wafer is first determined by interrogating the wafer to identify one or more of its optical, thermal, or electrical characteristics. This information regarding substrate type is then communicated to a separation apparatus, which then accomplishes precise physical separation of the substrate into discrete strips. Electrical performance of the strips may be tested prior to their incorporation into an assembled solar cell, where they are coupled to a concentrating element utilizing an elastomer encapsulant.

4 Claims, 13 Drawing Sheets

U.S. PATENT DOCUMENTS

| | | | |
|---|---|---|---|
| 4,293,192 A | 10/1981 | Bronstein | |
| 4,295,463 A | 10/1981 | Citron | |
| 4,333,447 A | 6/1982 | Lemrow et al. | |
| 4,355,478 A | 10/1982 | Armstrong | |
| 4,361,136 A | 11/1982 | Huang | |
| 4,362,903 A | 12/1982 | Eichelberger et al. | |
| 4,404,422 A | 9/1983 | Green et al. | |
| 4,440,153 A | 4/1984 | Melchior | |
| 4,449,514 A | 5/1984 | Selcuk | |
| 4,454,371 A | 6/1984 | Folino | |
| 4,457,297 A | 7/1984 | Sobczak et al. | |
| 4,463,749 A | 8/1984 | Sobczak et al. | |
| 4,495,360 A | 1/1985 | Anthony | |
| 4,511,618 A | 4/1985 | Duchene et al. | |
| 4,562,637 A | 1/1986 | Kushima et al. | |
| 4,571,812 A | 2/1986 | Gee | |
| 4,589,191 A | 5/1986 | Green et al. | |
| 4,638,110 A | 1/1987 | Erbert | |
| 4,663,562 A | 5/1987 | Miller et al. | |
| 4,668,314 A | 5/1987 | Endoh et al. | |
| 4,680,074 A | 7/1987 | Schmitz et al. | |
| 4,683,154 A | 7/1987 | Benson et al. | |
| 4,691,994 A | 9/1987 | Tveryanovich et al. | |
| 4,692,557 A | 9/1987 | Samuelson et al. | |
| 4,697,042 A | 9/1987 | Schilling | |
| 4,711,972 A | 12/1987 | O'Neill | |
| 4,830,038 A | 5/1989 | Anderson et al. | |
| 4,848,319 A | 7/1989 | Appeldorn | |
| 4,863,224 A | 9/1989 | Tveryanovich et al. | |
| 4,953,577 A | 9/1990 | Marshall | |
| 4,964,713 A | 10/1990 | Goetzberger | |
| 4,999,059 A | 3/1991 | Bagno | |
| 5,006,179 A | 4/1991 | Gaddy | |
| 5,011,544 A | 4/1991 | Gaddy et al. | |
| 5,043,198 A | 8/1991 | Maruyama et al. | |
| 5,080,725 A | 1/1992 | Green et al. | |
| 5,118,361 A | 6/1992 | Fraas et al. | |
| 5,153,780 A | 10/1992 | Jorgensen et al. | |
| 5,158,618 A | 10/1992 | Rubin et al. | |
| 5,167,724 A | 12/1992 | Chiang | |
| 5,174,275 A | 12/1992 | Holland | |
| 5,180,442 A | 1/1993 | Elias | |
| 5,180,888 A | 1/1993 | Sugiyama et al. | |
| 5,224,978 A | 7/1993 | Hermant et al. | |
| 5,240,510 A | 8/1993 | Goldade et al. | |
| 5,245,985 A | 9/1993 | Holland | |
| 5,261,970 A | 11/1993 | Landis et al. | |
| 5,344,496 A | 9/1994 | Stern et al. | |
| 5,356,488 A | 10/1994 | Hezel | |
| 5,365,920 A | 11/1994 | Lechner | |
| 5,395,070 A | 3/1995 | Wilk et al. | |
| 5,409,549 A | 4/1995 | Mori | |
| 5,436,725 A * | 7/1995 | Ledger | 356/504 |
| 5,449,626 A | 9/1995 | Hezel | |
| 5,460,659 A | 10/1995 | Krut | |
| 5,466,301 A | 11/1995 | Hammerbacher et al. | |
| 5,468,304 A | 11/1995 | Hammerbacher et al. | |
| 5,478,402 A | 12/1995 | Hanoka | |
| 5,498,297 A | 3/1996 | O'Neill et al. | |
| 5,508,205 A | 4/1996 | Dominquez et al. | |
| 5,517,339 A | 5/1996 | Riccobono et al. | |
| 5,529,054 A | 6/1996 | Shoen | |
| 5,542,409 A | 8/1996 | Sampayo | |
| 5,564,411 A | 10/1996 | Gerics et al. | |
| 5,616,186 A | 4/1997 | Fraas et al. | |
| 5,660,644 A | 8/1997 | Clemens | |
| 5,665,607 A | 9/1997 | Kawama et al. | |
| 5,707,459 A | 1/1998 | Itoyama et al. | |
| 5,709,833 A | 1/1998 | Simone | |
| 5,735,966 A | 4/1998 | Luch | |
| 5,782,993 A | 7/1998 | Ponewash | |
| 5,787,878 A | 8/1998 | Ratliff, Jr. | |
| 5,790,304 A | 8/1998 | Sanders et al. | |
| 5,840,147 A | 11/1998 | Grimm | |
| 5,846,444 A | 12/1998 | Edwards et al. | |
| 5,851,309 A | 12/1998 | Kousa | |
| 5,865,905 A | 2/1999 | Clemens | |
| 5,877,874 A | 3/1999 | Rosenberg | |
| 5,882,434 A | 3/1999 | Horne | |
| 5,915,170 A | 6/1999 | Raab et al. | |
| 5,919,316 A | 7/1999 | Bogorad et al. | |
| 5,936,777 A | 8/1999 | Dempewolf | |
| 5,959,787 A | 9/1999 | Fairbanks | |
| 5,964,216 A | 10/1999 | Hoffschmidt et al. | |
| 6,008,449 A | 12/1999 | Cole | |
| 6,020,553 A | 2/2000 | Yogev | |
| 6,034,322 A | 3/2000 | Pollard | |
| 6,049,035 A | 4/2000 | Tsuri et al. | |
| 6,057,505 A | 5/2000 | Ortabasi | |
| 6,074,614 A | 6/2000 | Hafeman et al. | |
| 6,084,175 A * | 7/2000 | Perry et al. | 136/256 |
| 6,091,017 A | 7/2000 | Stern | |
| 6,091,020 A | 7/2000 | Fairbanks et al. | |
| 6,092,392 A | 7/2000 | Verlinden et al. | |
| 6,093,757 A | 7/2000 | Pern | |
| 6,107,564 A | 8/2000 | Aguilera et al. | |
| 6,118,067 A | 9/2000 | Lashley et al. | |
| 6,134,784 A | 10/2000 | Carrie et al. | |
| 6,150,602 A | 11/2000 | Campbell | |
| 6,167,724 B1 | 1/2001 | Pozivil | |
| 6,242,685 B1 | 6/2001 | Mizukami et al. | |
| 6,252,155 B1 | 6/2001 | Ortabasi | |
| 6,264,510 B1 | 7/2001 | Onizuka et al. | |
| 6,274,402 B1 | 8/2001 | Verlinden et al. | |
| 6,274,860 B1 | 8/2001 | Rosenberg | |
| 6,293,803 B1 | 9/2001 | Rust et al. | |
| 6,294,723 B2 | 9/2001 | Uematsu et al. | |
| 6,309,901 B1 | 10/2001 | Tahon et al. | |
| 6,313,395 B1 | 11/2001 | Crane et al. | |
| 6,315,575 B1 | 11/2001 | Kajimoto | |
| 6,320,116 B1 | 11/2001 | Hanoka | |
| 6,323,415 B1 | 11/2001 | Uematsu et al. | |
| 6,333,457 B1 | 12/2001 | Mulligan et al. | |
| 6,333,458 B1 | 12/2001 | Forrest et al. | |
| 6,337,283 B1 | 1/2002 | Verlinden et al. | |
| 6,359,209 B1 | 3/2002 | Glenn et al. | |
| 6,365,823 B1 | 4/2002 | Kondo | |
| 6,387,726 B1 | 5/2002 | Verlinden et al. | |
| 6,395,972 B1 | 5/2002 | Tran et al. | |
| 6,423,568 B1 | 7/2002 | Verlinden et al. | |
| 6,429,037 B1 | 8/2002 | Wenham et al. | |
| 6,433,913 B1 | 8/2002 | Bauer et al. | |
| 6,437,236 B2 | 8/2002 | Watanabe et al. | |
| 6,440,769 B2 | 8/2002 | Peumans et al. | |
| 6,441,297 B1 | 8/2002 | Keller | |
| 6,479,744 B1 | 11/2002 | Tsuzuki et al. | |
| 6,528,716 B2 | 3/2003 | Collette et al. | |
| 6,528,718 B2 | 3/2003 | Yoda et al. | |
| 6,609,836 B1 | 8/2003 | Antonelli et al. | |
| 6,612,705 B1 | 9/2003 | Davidson et al. | |
| 6,617,505 B2 | 9/2003 | Shimada | |
| 6,619,282 B1 | 9/2003 | Murtha | |
| 6,620,995 B2 | 9/2003 | Vasylyev et al. | |
| 6,639,733 B2 | 10/2003 | Minano et al. | |
| 6,641,868 B2 | 11/2003 | Abe et al. | |
| 6,666,207 B1 | 12/2003 | Arkas et al. | |
| 6,676,263 B2 | 1/2004 | Winston | |
| 6,700,054 B2 | 3/2004 | Cherney et al. | |
| 6,700,055 B2 | 3/2004 | Barone | |
| 6,758,609 B2 | 7/2004 | Fathi et al. | |
| 6,761,598 B2 | 7/2004 | Onizuka et al. | |
| 6,804,062 B2 | 10/2004 | Atwater et al. | |
| 6,809,250 B2 | 10/2004 | Gerson | |
| 6,815,070 B1 | 11/2004 | Burkle et al. | |
| 6,822,157 B2 | 11/2004 | Fujioka | |
| 6,829,908 B2 | 12/2004 | Bowden et al. | |
| 6,843,573 B2 | 1/2005 | Rabinowitz et al. | |
| 6,849,797 B2 | 2/2005 | Koyanagi et al. | |
| 6,903,261 B2 | 6/2005 | Habraken et al. | |
| 6,958,868 B1 | 10/2005 | Pender | |
| 7,019,207 B2 | 3/2006 | Harneit et al. | |
| 7,055,519 B2 | 6/2006 | Litwin | |
| 7,071,134 B2 | 7/2006 | Koyama et al. | |
| 7,144,598 B2 | 12/2006 | Moravec et al. | |
| 7,156,666 B2 | 1/2007 | Mann | |
| 7,190,110 B2 | 3/2007 | Tokai et al. | |
| 7,250,209 B2 | 7/2007 | Shibahara et al. | |

| | | | |
|---|---|---|---|
| 7,282,240 B1 | 10/2007 | Jackman et al. | |
| 7,309,831 B2 | 12/2007 | Yamada et al. | |
| 7,423,083 B2 | 9/2008 | Kawaguchi et al. | |
| 7,595,543 B2 | 9/2009 | Weber et al. | |
| 2002/0007845 A1 | 1/2002 | Collette et al. | |
| 2002/0018308 A1 | 2/2002 | Winston | |
| 2002/0075579 A1 | 6/2002 | Vasylyev et al. | |
| 2002/0139414 A1 | 10/2002 | Vasylyev et al. | |
| 2003/0015233 A1 | 1/2003 | Barone | |
| 2003/0016539 A1 | 1/2003 | Minano et al. | |
| 2003/0021897 A1 | 1/2003 | Abe et al. | |
| 2003/0037569 A1 | 2/2003 | Arbab et al. | |
| 2003/0037814 A1 | 2/2003 | Cohen et al. | |
| 2003/0074976 A1 | 4/2003 | Ahmad | |
| 2003/0081333 A1 | 5/2003 | Winston | |
| 2003/0095340 A1 | 5/2003 | Atwater et al. | |
| 2003/0121542 A1 | 7/2003 | Harneit et al. | |
| 2003/0156337 A1 | 8/2003 | Davidson et al. | |
| 2003/0201007 A1 | 10/2003 | Fraas et al. | |
| 2003/0228114 A1 | 12/2003 | Fathi et al. | |
| 2003/0228417 A1 | 12/2003 | Nishikawa et al. | |
| 2004/0004216 A1* | 1/2004 | Eldridge et al. | 257/48 |
| 2004/0016454 A1 | 1/2004 | Murphy et al. | |
| 2004/0021964 A1 | 2/2004 | Rabinowitz et al. | |
| 2004/0084077 A1 | 5/2004 | Aylaian | |
| 2004/0092668 A1 | 5/2004 | Kawaguichi et al. | |
| 2004/0097012 A1 | 5/2004 | Weber et al. | |
| 2004/0108813 A1 | 6/2004 | Tokai et al. | |
| 2004/0123895 A1 | 7/2004 | Kardauskas et al. | |
| 2004/0134531 A1 | 7/2004 | Habraken et al. | |
| 2004/0194820 A1 | 10/2004 | Barone | |
| 2004/0229394 A1 | 11/2004 | Yamada | |
| 2004/0243364 A1 | 12/2004 | Wendelin et al. | |
| 2004/0246605 A1 | 12/2004 | Stiles et al. | |
| 2005/0070059 A1 | 3/2005 | Blakers et al. | |
| 2005/0081908 A1 | 4/2005 | Stewart | |
| 2005/0081909 A1 | 4/2005 | Paull | |
| 2005/0087294 A1 | 4/2005 | Rabinowitz | |
| 2005/0133082 A1 | 6/2005 | Konold et al. | |
| 2006/0054211 A1 | 3/2006 | Meyers et al. | |
| 2006/0099833 A1 | 5/2006 | Mann | |
| 2006/0105897 A1 | 5/2006 | Kasuga et al. | |
| 2006/0207646 A1 | 9/2006 | Terreau et al. | |
| 2006/0235717 A1 | 10/2006 | Sharma et al. | |
| 2006/0266406 A1 | 11/2006 | Faust et al. | |
| 2006/0272698 A1 | 12/2006 | Durvasula | |
| 2006/0283495 A1 | 12/2006 | Gibson | |
| 2007/0056626 A1 | 3/2007 | Funcell | |
| 2007/0095386 A1 | 5/2007 | Gibson | |
| 2007/0153354 A1 | 7/2007 | Duston et al. | |
| 2007/0251568 A1 | 11/2007 | Maeda | |
| 2008/0060696 A1 | 3/2008 | Ho et al. | |
| 2008/0197376 A1 | 8/2008 | Bert et al. | |
| 2008/0236650 A1 | 10/2008 | Gibson et al. | |
| 2008/0236655 A1 | 10/2008 | Baldwin et al. | |
| 2008/0236664 A1 | 10/2008 | Gibson et al. | |
| 2008/0241479 A1 | 10/2008 | Nghiem et al. | |
| 2008/0314438 A1 | 12/2008 | Tran et al. | |

FOREIGN PATENT DOCUMENTS

| | | |
|---|---|---|
| AU | 220348 A5 | 6/2002 |
| AU | 3902270 A4 | 5/2003 |
| AU | 2349175 AA | 6/2003 |
| CA | 2432300 AA | 6/2002 |
| CA | 2467112 AA | 6/2003 |
| DE | 298 23 351 U1 | 6/1999 |
| EP | 0029721 | 6/1981 |
| EP | 461124 B1 | 5/1995 |
| EP | 784870 | 4/1996 |
| EP | 657948 A3 | 6/1997 |
| EP | 1 030 376 A1 | 8/2000 |
| EP | 1174342 A1 | 1/2002 |
| EP | 1261039 A1 | 11/2002 |
| EP | 1131586 B1 | 3/2003 |
| EP | 1342259 A1 | 9/2003 |
| EP | 1112597 B1 | 3/2004 |
| EP | 1 427 025 A2 | 6/2004 |
| EP | 1461834 A1 | 9/2004 |
| EP | 1 630 875 A2 | 3/2006 |
| EP | 1732141 A1 | 12/2006 |
| GB | 1187969 | 4/1970 |
| JP | 61044741 A | 3/1986 |
| JP | 09018031 A1 | 1/1997 |
| JP | 10104547 A2 | 4/1998 |
| WO | WO 9118420 A1 | 11/1991 |
| WO | WO 9406046 A1 | 3/1994 |
| WO | WO 9506330 A1 | 3/1995 |
| WO | WO 9533220 A1 | 12/1995 |
| WO | WO 9623115 A1 | 8/1996 |
| WO | WO 9624954 A1 | 8/1996 |
| WO | WO 9803823 A1 | 1/1998 |
| WO | WO 9832164 A1 | 7/1998 |
| WO | WO 9905462 A1 | 2/1999 |
| WO | WO 0074147 A1 | 12/2000 |
| WO | WO 0079593 A1 | 12/2000 |
| WO | WO 0151962 A2 | 7/2001 |
| WO | WO 0155650 A3 | 8/2001 |
| WO | WO 0190661 A3 | 11/2001 |
| WO | WO 0208058 A1 | 1/2002 |
| WO | WO 0245143 A1 | 6/2002 |
| WO | WO 02075225 A2 | 9/2002 |
| WO | WO 0155650 C2 | 10/2002 |
| WO | WO 02095838 A1 | 11/2002 |
| WO | WO 03019083 A1 | 3/2003 |
| WO | WO 03022578 A1 | 3/2003 |
| WO | WO 03047004 A1 | 6/2003 |
| WO | WO 03049201 A1 | 6/2003 |
| WO | WO 03107078 A2 | 12/2003 |
| WO | WO 2004100252 A1 | 11/2004 |
| WO | WO 2006/015430 A1 | 2/2006 |
| WO | WO 2006/089540 A2 | 8/2006 |
| WO | WO 2006/123194 A1 | 11/2006 |
| WO | WO 2006/128417 A1 | 12/2006 |
| WO | WO 2006/133126 A2 | 12/2006 |
| WO | WO 2007/036199 A2 | 4/2007 |

OTHER PUBLICATIONS

Solar Electricity Beginner Notes, http://www.sunwindsolar.com/a_lessons/solar_beginner_notes.html; Jan. 8, 2004; pp. 1-2.
ACLAR Fluropolymer Film by SPI Supplies, http://web.archive.org/web/20021022180352/http://www.2spi.com/catalog/photo/acalr-film.shtml, 3 pages.
Andreev et al., "Concentrator PV Modules of "All-Glass" Design With Modified Structure;" Paper 3P-C3-72 presented at WCPEC-3, Osaka Japan; May 11-18, 2003; 4 pages.
Breeze, A.J., et al., "Improving power efficiencies in polymer—polymer blend photvoltaics", Solar Energy Materials & Solar Cells, 83, 2004, pp. 263-271.
3M Glass Bubbles, Product Catalogue for 3M Energy and Advance Materials, Feb. 18, 2009, pp. 1-3.
Emissivity Values for Common Materials, http://www.infrared-thermography.com/ materials-1.htm, retrieved on Apr. 2, 2010, 4 pages.
King et al. "Photovoltaic Module Performance and Durability Following Long-Term Field Exposure", Prog. Photovol: Res. and Appl., vol. 8, No. 2, p. 241-256 (May 23, 2000).
Marayuma, T., et al. "Wedge-shaped light concentrator using total internal reflection", Solar Energy Materials & Solar Cells, 57, (1999), pp. 75-83.
Nitto Denko, Web page: http://www.nitto.com/ product/datasheet/037/index.html as updated on Apr. 18, 2005 from Internet Archive, 2 pages.
Pern et al, "Photothermal Stability of an E-Beam Pre-Crosslinked EVA Encapsulant and Its Performance Degradation on a-Si Submodules", NREL/CP-520-31026, Oct. 2001, Lakewood, Colorado, 4 pages.
Petrie, "Additives in Radiation (EB/UV) Cured Adhesive Formulations" www.specialchem4adhesives.com, Oct. 14, 2002, 6 pages.
Photovoltaic/Solar Panel Laminations; MADICO, http://www.madico.com/specialty_pv.asp; Jun. 11, 2007; pp. 1-2.
Wells, G.M., et al. "Effects of mirror surface roughness on exposure field uniformity in synchrontron x-ray lithography", American Vacuum Society, J. Vac. Sci. Technol., 1991, pp. 3227-3231.

International Search Report and Written Opinion for PCT Application No. PCT/US2010/024943, mailed Apr. 22, 2010, 9 pages.
International Search Report and Written Opinion for PCT Application No. PCT/US08/71127, mailed Oct. 22, 2008, 9 pages.
International Search Report and Written Opinion for PCT Application No. PCT/US2008/059170 mailed Aug. 6, 2008, 8 pages.
International Search Report and Written Opinion for PCT Application No. PCT/US2008/075134 mailed Dec. 5, 2008, 9 pages.
International Search Report and Written Opinion for PCT Application No. PCT/US2008/064132 mailed Aug. 15, 2008, 8 pages.
International Search Report and Written Opinion for PCT Application No. PCT/US 08/59167, mailed on Dec. 8, 2008, 11 pages.
International Search Report and Written Opinion for PCT Application No. PCT/US06/35793, mailed on May 10, 2007, 8 pages.
International Search Report and Written Opinion of PCT Application No. PCT/US06/29164, mailed on Jun. 5, 2008, 16 pages total.
International Search Report and Written Opinion for PCT Application No. PCT/US06/21803, dated Aug. 30, 2007, 21 pages total.
Office Action for Chinese Patent Application No. 200680026582.4, mail date of May 27, 2010, 14 pages.
Office Action for U.S. Appl. No. 11/445,933 dated Apr. 14, 2010, 7 pages.
Office Action for U.S. Appl. No. 11/445,933 dated Oct. 14, 2009, 8 pages.
Office Action for U.S. Appl. No. 11/445,948 dated Apr. 15, 2010, 27 pages.
Office Action for U.S. Appl. No. 11/445,948 dated May 22, 2009, 18 pages.
Office Action for U.S. Appl. No. 11/354,530 dated Jan. 6, 2010, 7 pages.
Office Action for U.S. Appl. No. 11/493,380 dated Jul. 22, 2009, 22 pages.
Office Action for U.S. Appl. No. 11/493,380 dated Feb. 17, 2009, 24 pages.
Office Action for U.S. Appl. No. 11/493,380 dated May 30, 2008, 25 pages.
Office Action for U.S. Appl. No. 12/136,572 dated Feb. 4, 2010, 15 pages.
Office Action for U.S. Appl. No. 12/136,574 dated Jan. 12, 2010, 15 pages.
Office Action for U.S. Appl. No. 12/136,574 dated Jun. 8, 2009, 10 pages.
Office Action for U.S. Appl. No. 12/136,574 dated Dec. 29, 2008, 9 pages.
Office Action for U.S. Appl. No. 12/136,577 dated Jun. 8, 2009, 12 pages.
Office Action for U.S. Appl. No. 12/136,581 dated Feb. 4, 2010, 13 pages.
Office Action for U.S. Appl. No. 11/402,490 dated Oct. 30, 2009, 12 pages.
Office Action for U.S. Appl. No. 11/402,490 dated Mar. 3, 2009, 18 pages.
Office Action for U.S. Appl. No. 12/167,198 dated Dec. 19, 2008, 15 pages.
Office Action for U.S. Appl. No. 11/254,114 dated Feb. 2, 2010, 10 pages.
Office Action for U.S. Appl. No. 11/252,425 dated Oct. 16, 2009, 6 pages.
Office Action for U.S. Appl. No. 11/252,425 dated Mar. 19, 2009, 6 pages.
Office Action for U.S. Appl. No. 11/252,425 dated Jul. 9, 2008, 6 pages.
Office Action for U.S. Appl. No. 11/253,418 dated Sep. 11, 2009, 20 pages.
Office Action for U.S. Appl. No. 11/253,202 dated Aug. 31, 2009, 19 pages.
Office Action for U.S. Appl. No. 11/253,202 dated Feb. 19, 2009, 22 pages.
Office Action for U.S. Appl. No. 11/252,399 dated Dec. 4, 2009, 22 pages.
Office Action for U.S. Appl. No. 11/252,399 dated Jun. 2, 2009, 17 pages.
Office Action for U.S. Appl. No. 11/252,399 dated Aug. 20, 2008, 16 pages.
Office Action for U.S. Appl. No. 11/254,041 dated Jan. 26, 2010, 8 pages.
Office Action for U.S. Appl. No. 11/290,313 dated Apr. 15, 2010, 10 pages.
Office Action for U.S. Appl. No. 11/290,313 dated Sep. 21, 2009 7 pages.
Office Action for U.S. Appl. No. 11/753,546 dated Mar. 31, 2010, 10 pages.
Office Action for U.S. Appl. No. 12/060,801 dated Apr. 13, 2010, 24 pages.
Office Action for U.S. Appl. No. 12/332,340 dated Apr. 26, 2010, 17 pages.
Office Action for U.S. Appl. No. 11/841,899 of Mar. 11, 2008, 18 pages.

* cited by examiner

SECTION C-C

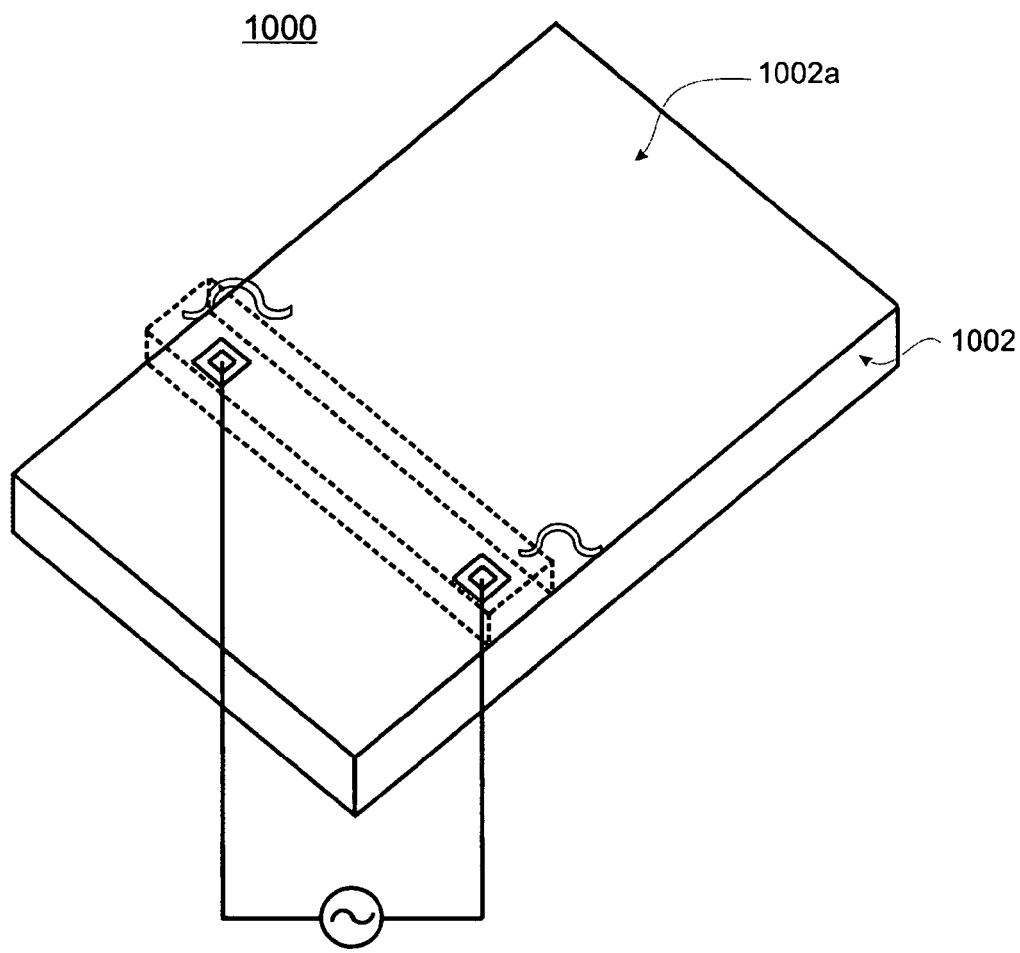

FABRICATION PROCESS FOR PHOTOVOLTAIC CELL

BACKGROUND OF THE INVENTION

The present invention relates generally to solar energy techniques. In particular, the present invention provides a method and resulting device fabricated from a plurality of photovoltaic regions provided within one or more substrate members. More particularly, the present invention provides a method and resulting device for manufacturing the photovoltaic regions within the substrate member, which is coupled to a plurality of concentrating elements, using a coupling technique between the photovoltaic regions and respective concentrating elements. Merely by way of example, the invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. For example, solar cells are often costly. Depending upon the geographic region, there are often financial subsidies from governmental entities for purchasing solar panels, which often cannot compete with the direct purchase of electricity from public power companies.

Moreover, the conventional panels are often composed of silicon bearing wafer materials. Such wafer materials are often costly and difficult to manufacture efficiently on a large scale. Availability of solar panels is also somewhat scarce. That is, solar panels are often difficult to find and purchase from limited sources of photovoltaic silicon bearing materials.

In addition, conventional silicon bearing semiconductor wafer materials exhibit substantial variation in design. For example, some solar cell semiconductor wafer designs exhibit electrical contacts on both the front and back side of the wafer, while other solar cell semiconductor wafer designs exhibit electrical contacts only on one side. This nonuniformity in design makes it difficult to adapt these conventional semiconductor wafer designs for use in a common solar panel.

From the above, it is seen that techniques for improving solar devices is highly desirable.

BRIEF SUMMARY OF THE INVENTION

According to the present invention, techniques related to solar energy are provided. In particular, the present invention provides a method and resulting device fabricated from a plurality of photovoltaic regions provided within one or more substrate members. More particularly, the present invention provides a method and resulting device for manufacturing the photovoltaic regions within the substrate member, which is coupled to a plurality of concentrating elements, using a coupling technique between the photovoltaic regions and respective concentrating elements Merely by way of example, the invention has been applied to solar panels, commonly termed modules, but it would be recognized that the invention has a much broader range of applicability.

According to embodiments of the present invention, a photovoltaic strip is physically separated from a semiconductor wafer utilizing physical sawing or other techniques. In accordance with one embodiment, an identity/source of the semiconductor wafer is first determined by interrogating the wafer to identify one or more of its optical, thermal, or electrical characteristics. This information regarding substrate type is then communicated to a separation apparatus, which then accomplishes precise physical separation of the substrate into discrete strips. The electrical performance of the strips is then tested prior to their incorporation into an assembled solar cell, where they are coupled to a concentrating element utilizing an elastomer encapsulant.

An embodiment of a method for creating a photovoltaic strip in accordance with an embodiment of the present invention for incorporation into a solar cell, comprises, providing a semiconductor wafer having a PN junction and a first electrical contact and a second electrical contact, the semiconductor wafer further comprising a photovoltaic strip. The semiconductor wafer is interrogated to identify its type, and the photovoltaic strip is physically separated from the semiconductor wafer based upon wafer type.

An embodiment of a method in accordance with the present invention for fabricating a solar cell, comprises, interrogating a semiconductor substrate with at least one of optical, thermal, and electrical techniques to detect at least one characteristic of the substrate. The characteristic is compared to information stored in a database regarding a plurality of substrate types, in order to determine a type of the substrate, and the semiconductor substrate is separated into one or more photovoltaic strips based upon the substrate type determined.

An embodiment of an apparatus in accordance with the present invention for testing a photovoltaic strip, comprises, a jig comprising a surface, a first electrical contact located on a first side of the jig surface, the first electrical contact in electrical communication with a first terminal of a power supply, and a second electrical contact located on a second side of the jig surface opposite to the first side, the second electrical contact in electrical communication a second terminal of the power supply. The apparatus further comprises a member for securing a photovoltaic strip onto the surface, such that a region of a first conductivity type in the substrate is in electrical communication with the first electrical contact, and a region of the second conductivity type in the substrate is in electrical communication with the second electrical contact.

An embodiment of an apparatus in accordance with the present invention for identifying a type of semiconductor substrate, comprises, a member configured to support a substrate thereon, a first conducting pin configured to be in electrical communication with a first electrical contact located on a back side of the supported substrate, and a second conducting pin configured to be in electrical communication with a second electrical contact located on front side of the supported substrate.

Various additional objects, features and advantages of the present invention can be more fully appreciated with reference to the detailed description and accompanying drawings that follow.

BRIEF DESCRIPTION OF THE DRAWINGS

FIG. 10 shows a simplified perspective view of an embodiment of a testing jig for photovoltaic strips.

DETAILED DESCRIPTION OF THE INVENTION

Figure 1:
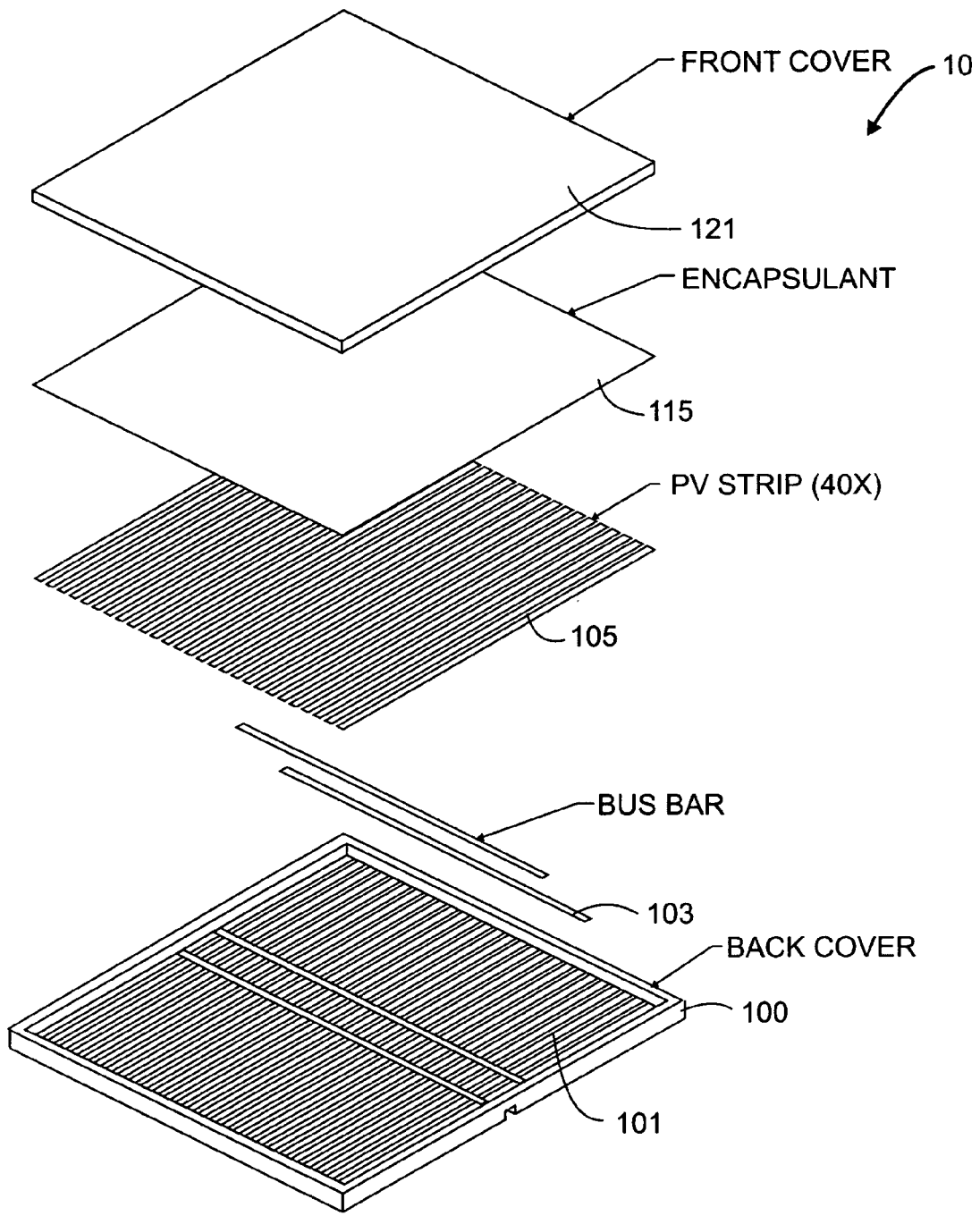
FIG. 1 is a simplified diagram illustrating an expanded view of a solar cell structure according to an embodiment of the present invention.

According to the present invention, techniques related to solar energy are provided. In particular, the present invention provides a method and resulting device fabricated from a plurality of photovoltaic regions provided within one or more substrate members. More particularly, the present invention provides a method and resulting device for manufacturing the photovoltaic regions within the substrate member, which is coupled to a plurality of concentrating elements. Merely by way of example, the invention has been applied to solar panels, commonly termed modules, but it would be recognized that the invention has a much broader range of applicability.

According to embodiments of the present invention, a photovoltaic strip is physically separated from a semiconductor wafer utilizing physical sawing or other techniques. In accordance with one embodiment, an identity/source of the semiconductor wafer is first determined by interrogating the wafer to identify one or more of its optical, thermal, or electrical characteristics. This information regarding substrate type is then communicated to a separation apparatus, which then accomplishes precise physical separation of the substrate into discrete strips. The electrical performance of the strips is then tested prior to their incorporation into an assembled solar cell, where they are coupled to a concentrating element utilizing an elastomer encapsulant.

A method for fabricating a solar cell structure according to an embodiment of the present invention may be outlined as follows:

1. Provide a semiconductor wafer having photovoltaic regions thereon;
2. Identify the specific configuration of the photovoltaic regions on the semiconductor wafer;
3. Physically separate the semiconductor wafer into photovoltaic strips;
4. Test the photovoltaic strips;
5. Provide the at least one photovoltaic strip on a lead frame member;
6. Provide an optical elastomer material having a first thickness;
7. Provide a second substrate member comprising at least one optical concentrating element thereon;

8. Couple the optical concentrating element such that the optical elastomer material is in between the surface region of the photovoltaic strip and the second side of the optical concentrating element;

9. Form a first interface within a vicinity of the surface region and the thickness of the optical elastomer material;

10. Form a second interface within a vicinity of the second side and the optical elastomer material;

11. Maintain a spacing between the second side of the optical concentrating element and the surface region of the photovoltaic strip using a plurality of particles having a predetermined dimension spatially disposed overlying the surface region of the photovoltaic strip and within a second thickness of the optical elastomer material;

12. Cure the optical elastomer material between the surface region and the second side;

13. Provide the first interface substantially free from one or more gaps (e.g., air gaps and/or pockets, bubbles, vapor) and the second interface substantially free from one or more gaps to form a substantially continuous optical interface from the first side of the optical concentrating element, through the first interface, and through the second interface to the photovoltaic strip; and 14. Perform other steps, as desired.

The above sequence of steps provides a method according to an embodiment of the present invention. As shown, the method uses a combination of steps including a way of forming a solar cell for a solar panel, which has a plurality of solar cells. Other alternatives can also be provided where steps are added, one or more steps are removed, or one or more steps are provided in a different sequence without departing from the scope of the claims herein. Further details of the present method and resulting structures can be found throughout the present specification and more particularly below.

Referring now to FIG. 1, an expanded view 10 of a solar cell structure according to an embodiment of the present invention is illustrated. This diagram is merely an example, which should not unduly limit the scope of the claims herein. One of ordinary skill in the art would recognize many variations, modifications, and alternatives. As shown is an expanded view of the present solar cell device structure, which includes various elements. The device has a back cover member 101, which includes a surface area and a back area. The back cover member also has a plurality of sites, which are spatially disposed, for electrical members, such as bus bars, and a plurality of photovoltaic regions. In a specific embodiment, the bus bars can be provided on a lead frame structure, which will be described in more detail throughout the present specification and more particularly below. Of course, there can be other variations, modifications, and alternatives.

In a preferred embodiment, the device has a plurality of photovoltaic strips 105, each of which is disposed overlying the surface area of the back cover member. In a preferred embodiment, the plurality of photovoltaic strips correspond to a cumulative area occupying a total photovoltaic spatial region, which is active and converts sunlight into electrical energy. Of course, there can be other variations, modifications, and alternatives.

Photovoltaic strips 105 are typically formed by physical separation from a semiconductor wafer having photovoltaic regions. Typically, this physical separation is accomplished by sawing through the semiconductor wafer, although this physical separation can alternatively be accomplished by other methods, such as a combination of sawing and snapping along a axis of the lattice cell structure. Formation of the photovoltaic strips is discussed in detail below in connection with FIGS. 6-10.

An encapsulating material 115 is overlying a portion of the back cover member. That is, an encapsulating material forms overlying the plurality of strips, and exposed regions of the back cover, and electrical members. In a preferred embodiment, the encapsulating material can be a single layer, multiple layers, or portions of layers, depending upon the application. Of course, there can be other variations, modifications, and alternatives.

In a specific embodiment, a front cover member 121 is coupled to the encapsulating material. That is, the front cover member is formed overlying the encapsulant to form a multilayered structure including at least the back cover, bus bars, plurality of photovoltaic strips, encapsulant, and front cover. In a preferred embodiment, the front cover includes one or more concentrating elements, which concentrate (e.g., intensify per unit area) sunlight onto the plurality of photovoltaic strips. That is, each of the concentrating elements can be associated respectively with each of or at least one of the photovoltaic strips.

Upon assembly of the back cover, bus bars, photovoltaic strips, encapsulant, and front cover, an interface region is provided along at least a peripheral region of the back cover member and the front cover member. The interface region may also be provided surrounding each of the strips or certain groups of the strips depending upon the embodiment. The device has a sealed region and is formed on at least the interface region to form an individual solar cell from the back cover member and the front cover member. The sealed region maintains the active regions, including photovoltaic strips, in a controlled environment free from external effects, such as weather, mechanical handling, environmental conditions, and other influences that may degrade the quality of the solar cell. Additionally, the sealed region and/or sealed member (e.g., two substrates) protect certain optical characteristics associated with the solar cell and also protects and maintains any of the electrical conductive members, such as bus bars, interconnects, and the like. Of course, there can be other benefits achieved using the sealed member structure according to other embodiments.

In a preferred embodiment, the total photovoltaic spatial region occupies a smaller spatial region than the surface area of the back cover. That is, the total photovoltaic spatial region uses less silicon than conventional solar cells for a given solar cell size. In a preferred embodiment, the total photovoltaic spatial region occupies about 80% and less of the surface area of the back cover for the individual solar cell. Depending upon the embodiment, the photovoltaic spatial region may also occupy about 70% and less or 60% and less or preferably 50% and less of the surface area of the back cover or given area of a solar cell. Of course, there can be other percentages that have not been expressly recited according to other embodiments. Here, the terms "back cover member" and "front cover member" are provided for illustrative purposes, and not intended to limit the scope of the claims to a particular configuration relative to a spatial orientation according to a specific embodiment. Further details of various elements in the solar cell can be found throughout the present specification and more particularly below. More particularly, certain details on coupling each of the photovoltaic regions to the concentrating elements can be found throughout the present specification and more particularly below.

Figure 2:
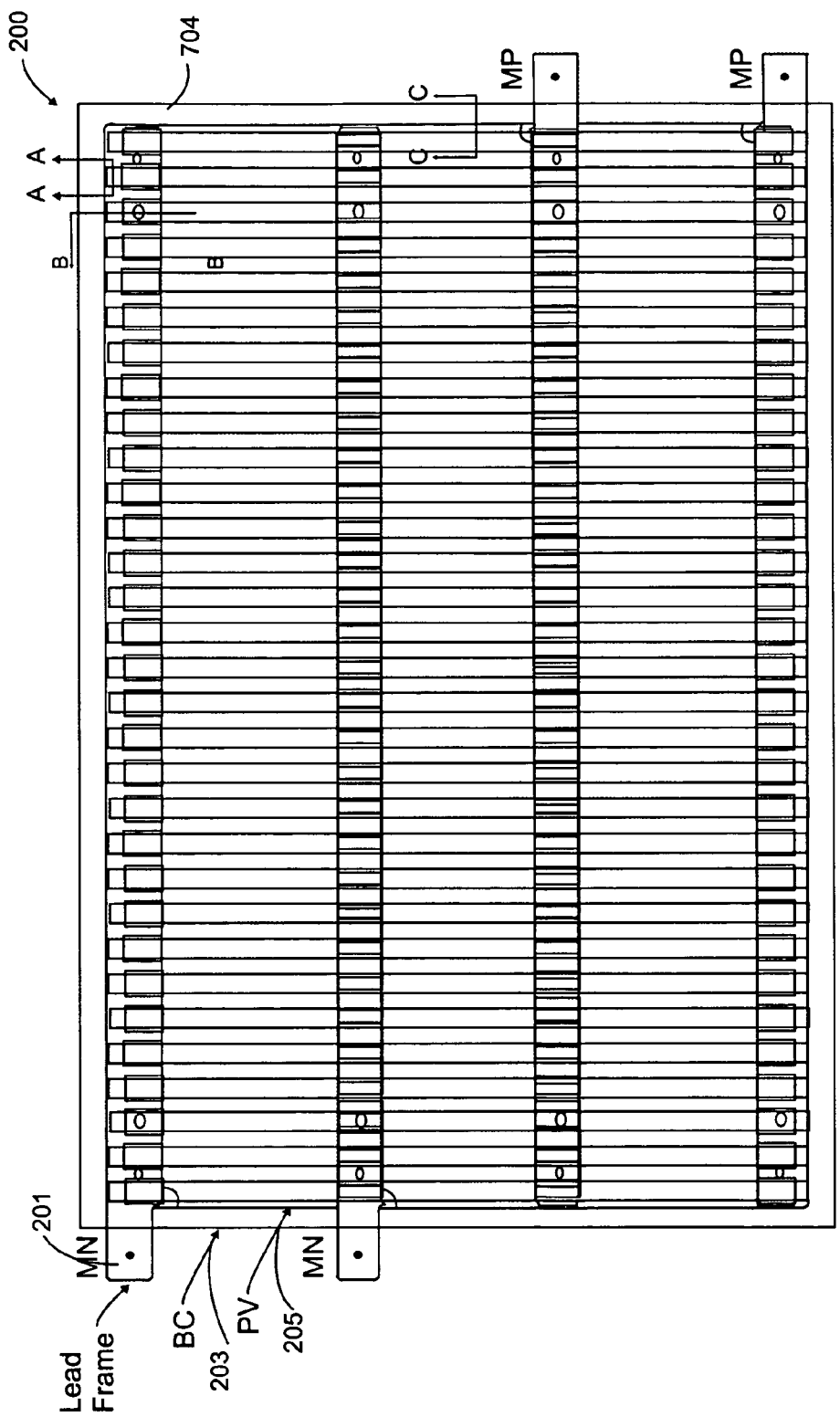
FIG. 2 is a simplified top-view diagram of a solar cell according to an embodiment of the present invention.

FIG. 2 is a simplified top-view diagram 200 of a solar cell according to an embodiment of the present invention. This diagram is merely an example, which should not unduly limit the scope of the claims herein. One of ordinary skill in the art would recognize many variations, modifications, and alternatives. In an alternative specific embodiment, the present invention provides a solar cell device. The device has a housing member, which is a back cover member 203. The device also has a lead frame member 201 coupled to the housing member. In a specific embodiment, the lead frame member can be selected from a copper member and/or an Alloy 42 member. Of course, there can be other variations, modifications, and alternatives.

In a preferred embodiment, the lead frame member has at least one photovoltaic strip 205 thereon, which has a surface region and a back side region. In a specific embodiment, each of the photovoltaic strips is made of a silicon bearing material, which includes a photo energy conversion device therein. That is, each of the strips is made of single crystal and/or poly crystalline silicon that have suitable characteristics to cause it to convert applied sunlight or electromagnetic radiation into electric current energy according to a specific embodiment. An example of such a strip is called the Sliver Cell® product manufactured by Origin Energy of Australia, but can be others. In other examples, the strips or regions of photovoltaic material can be made of other suitable materials such as other semiconductor materials, including semiconductor elements listed in the Periodic Table of Elements, polymeric materials that have photovoltaic properties, or any combination of these, and the like. In a specific embodiment, the photovoltaic region is provided on the lead frame using a conductive epoxy paste and/or solder adhesive, including paste and/or other bonding techniques. Of course, there can be other variations, modifications, and alternatives.

In a specific embodiment, the device has an optical elastomer material having a first thickness overlying the surface region of the photovoltaic surface. The elastomer material is an optical elastomer material, which begins as a liquid (e.g., paste, soft paste) and cures to form a solid material, e.g., pliable. The elastomer material has suitable thermal and optical characteristics. That is, a refractive index of the elastomer material is substantially matched to a overlying concentrating element according to a specific embodiment. In a specific embodiment, the encapsulant material adapts for a first coefficient of thermal expansion of the plurality of photovoltaic strips on the lead frame member and a second coefficient of thermal expansion associated with the concentrating element. In a specific embodiment, the encapsulant material facilitates transfer of one of more photons between one of the concentrating elements and one of the plurality of photovoltaic strips. The encapsulant material can act as a barrier material, an electrical isolating structure, a glue layer, and other desirable features. The encapsulating material can also be a tape and/or film according to a specific embodiment. Depending upon the embodiment, the encapsulant material can be cured using a thermal, ultraviolet, and/or other process according to a specific embodiment. Of course, there can be other variations, modifications, and alternatives. In a specific embodiment, the device has a second substrate member comprising at least one optical concentrating element thereon. Further details of the concentrating element and other features can be found in the figures described below.

Figure 3:
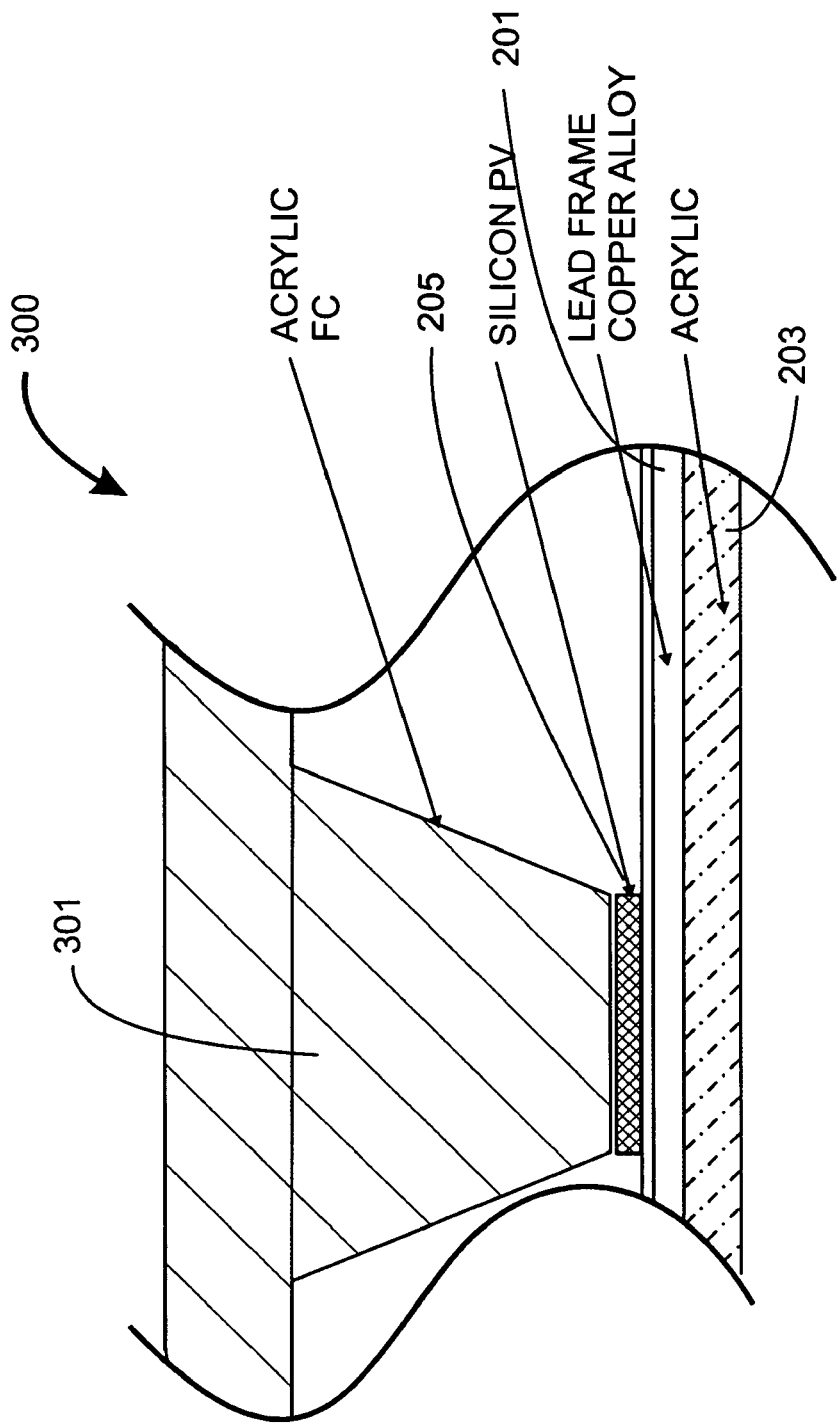
FIG. 3 is a detailed cross-sectional view diagram of a photovoltaic region coupled to a concentrating element of a solar cell according to an embodiment of the present invention.

FIG. 3 is a detailed cross-sectional view diagram 300 of a photovoltaic region coupled to a concentrating element of a solar cell according to an embodiment of the present invention. This diagram is merely an example, which should not unduly limit the scope of the claims herein. One of ordinary skill in the art would recognize many variations, modifications, and alternatives. As shown, FIG. 3 is a cross section of "SECTION A-A" illustrated in FIG. 2. As shown, the device has an optical concentrating element 301, which has a first side and a second side. The device also has other element including the back cover, photovoltaic region, lead frame, and others. Specific details of other views of the device are provided throughout the present specification and more particularly below.

Figure 4:
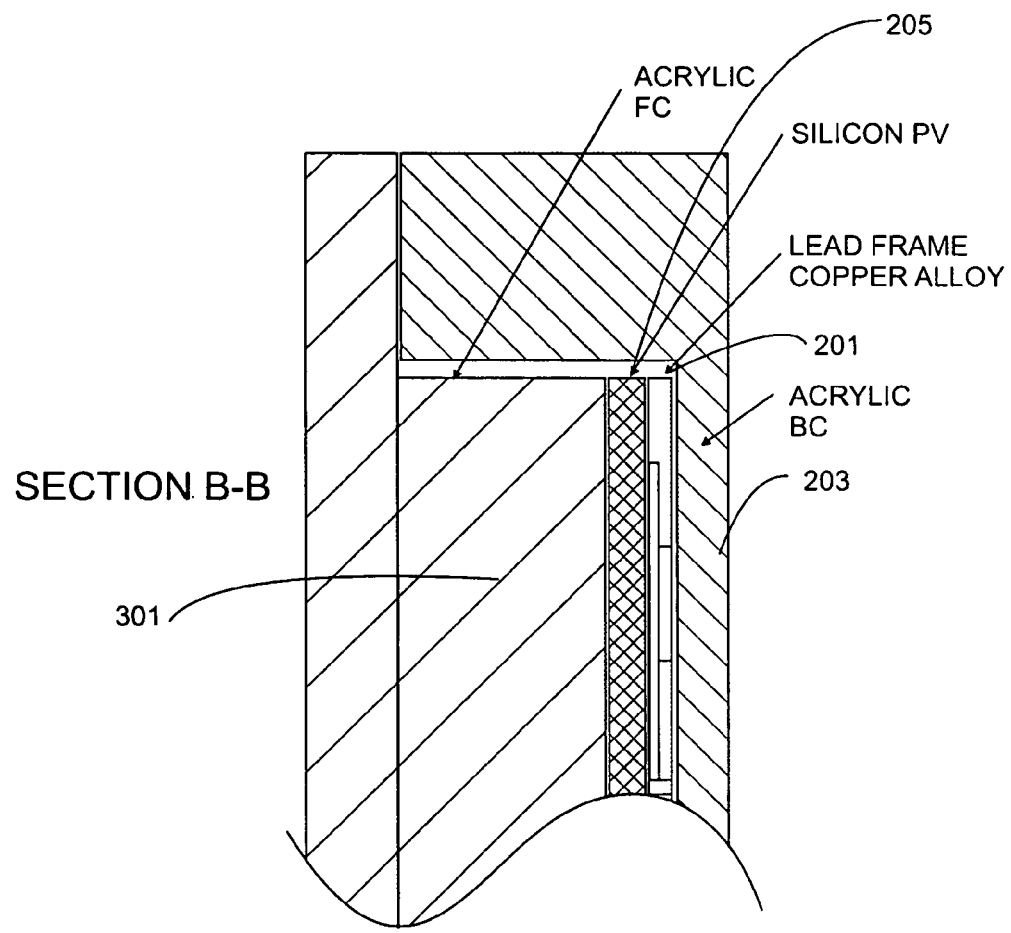
FIG. 4 is a detailed alternative cross-sectional view diagram of a photovoltaic region coupled to a concentrating element of a solar cell according to an embodiment of the present invention.

FIG. 4 is a detailed alternative cross-sectional view diagram 400 of a photovoltaic region coupled to a concentrating element of a solar cell according to an embodiment of the present invention. This diagram is merely an example, which should not unduly limit the scope of the claims herein. One of ordinary skill in the art would recognize many variations, modifications, and alternatives. As shown, FIG. 4 is a cross section of "SECTION B-B" illustrated in FIG. 2. As shown, the device has an optical concentrating element 301, which has a first side and a second side. The device also has other element including the back cover, photovoltaic region, lead frame, and others. Specific details of other views of the device are provided throughout the present specification and more particularly below.

Figure 5:
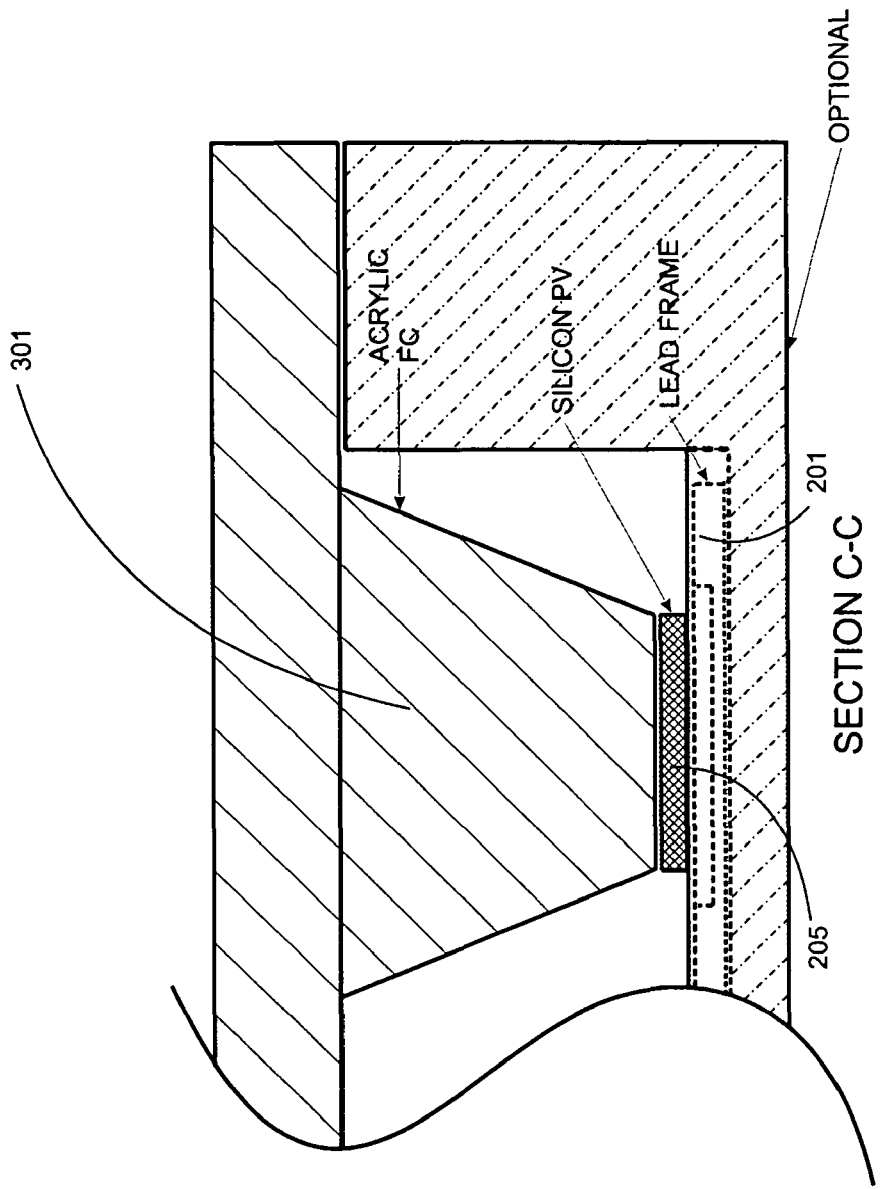
FIG. 5 is a detailed cross-sectional view diagram of a photovoltaic region coupled to a concentrating element of a solar cell according to an embodiment of the present invention.
Figure 5A:
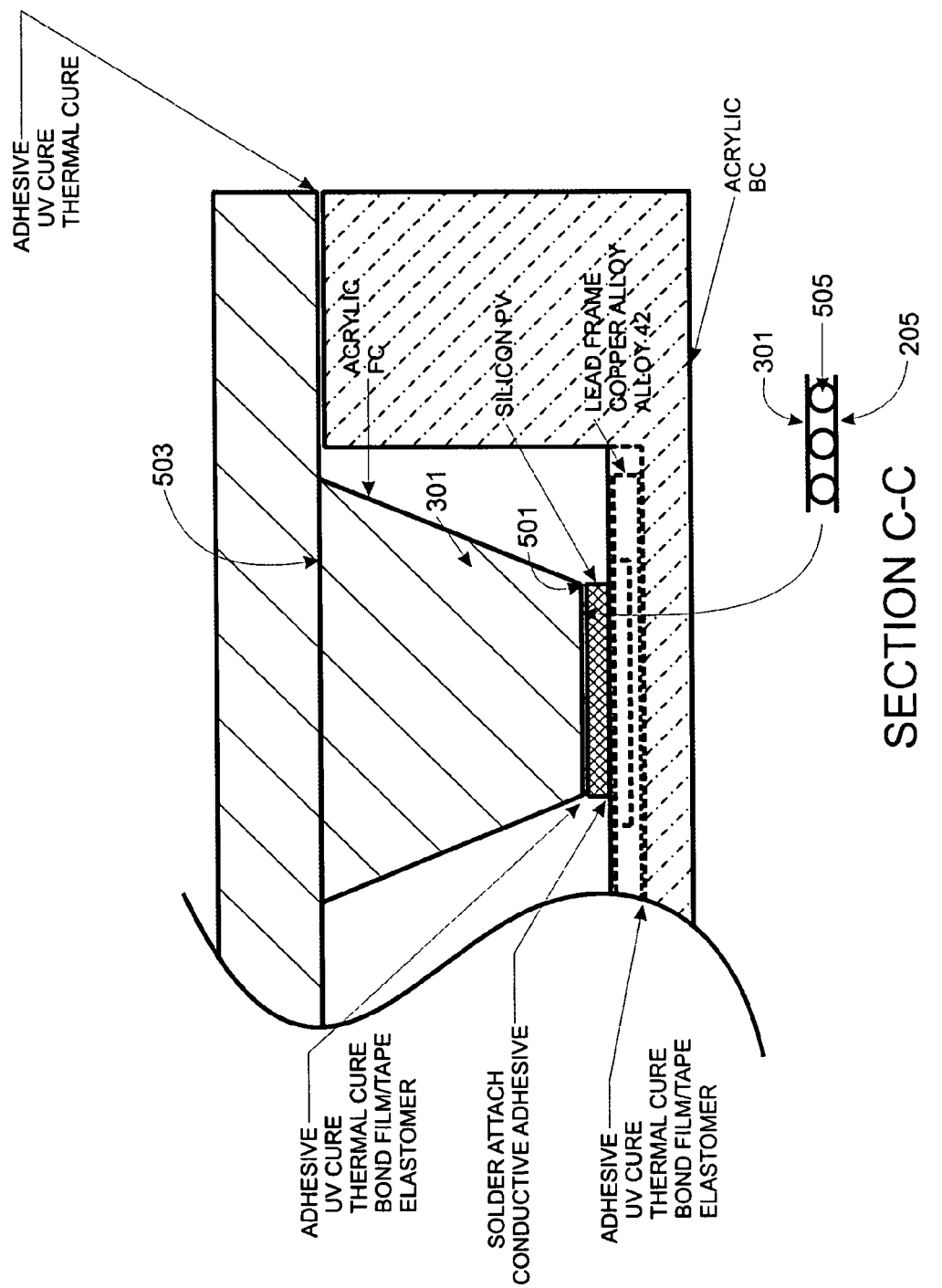
FIG. 5A is a larger detailed cross-sectional view diagram of the photovoltaic region coupled to the concentrating element of the solar cell of FIG. 5 according to an embodiment of the present invention.

FIG. 5 is a detailed cross-sectional view diagram of a photovoltaic region coupled to a concentrating element of a solar cell according to an embodiment of the present invention. This diagram is merely an example, which should not unduly limit the scope of the claims herein. One of ordinary skill in the art would recognize many variations, modifications, and alternatives. As shown, FIG. 5 is a cross section of "SECTION C-C" illustrated in FIG. 2. More specifically, FIG. 5A is a larger detailed cross-sectional view diagram of the photovoltaic region coupled to the concentrating element of the solar cell of FIG. 5 according to an embodiment of the present invention. This diagram is merely an example, which should not unduly limit the scope of the claims herein. One of ordinary skill in the art would recognize many variations, modifications, and alternatives. As shown, the device has an optical concentrating element 301, which has a first side 503 and a second side 501. The device also has other element including the back cover, photovoltaic region, lead frame, and others.

In a specific embodiment, the device has a first interface within a vicinity of the surface region and the first thickness of the optical elastomer material. The device also has a second interface within a vicinity of the second side and the optical elastomer material. In a specific embodiment, the optical concentrating element 301 is coupled to the surface region of the photovoltaic strip 205 such that the optical elastomer material is in between the surface region of the photovoltaic strip and the second side of the optical concentrating element. In a specific embodiment, the device has a spacing comprising essentially the optical elastomer material between the second side of the optical concentrating element and the surface region of the photovoltaic strip. The device has a plurality of particles 505 having a predetermined dimension (e.g., non-compressible and substantially non-deformable particles, spherical glass particles, which are substantially transparent) spatially disposed overlying the surface region of the photovoltaic strip and within a second thickness of the optical elastomer material to define the spacing between the surface region and the second side of the optical concentrating element. In a specific embodiment, the second thickness is the same as the first thickness, although they can differ in other embodiments. In a specific embodiment, the first interface is substantially free from one or more gaps (e.g., air gaps and/or pockets) and the second interface substantially free from one or more gaps to form a substantially continuous optical interface from the first side of the optical concentrating element, through the first interface, and through the second interface to the photovoltaic strip. Of course, there can be other variations, modifications, and alternatives.

As described above in connection with FIGS. 2-5, embodiments of solar devices in accordance with the present invention feature a plurality of photovoltaic elements in the form of silicon strips 205. These strips 205 are obtained by cutting sections of an existing semiconductor wafer which has been patterned to exhibit specific photovoltaic regions.

Figure 6:
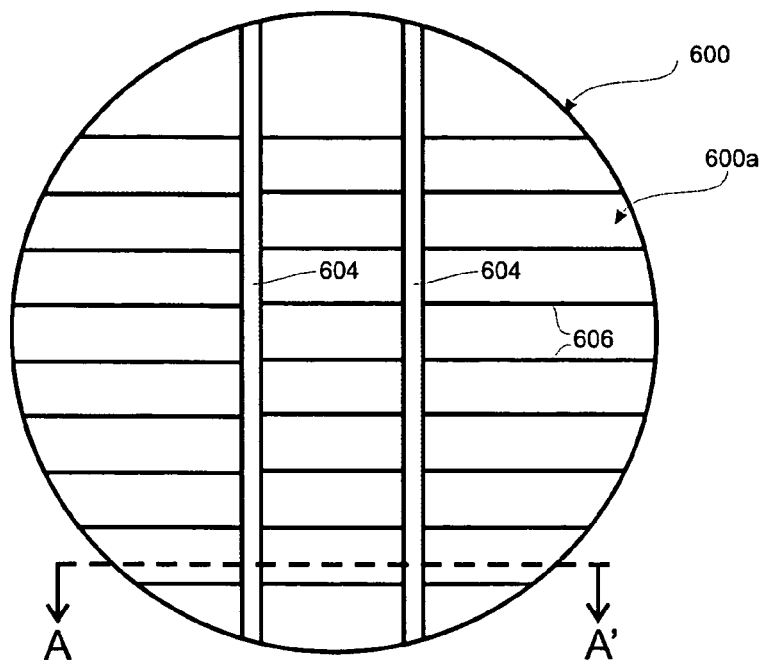
FIG. 6 is a simplified top plan view of one type of a conventional semiconductor wafer configured to generate electrical current in response to incident light.
Figure 6A:
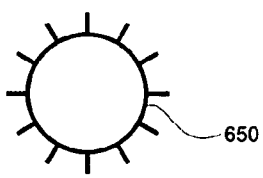
FIG. 6A is a simplified cross-sectional view of the conventional semiconductor wafer shown in FIG. 6.

For example, FIGS. 6 and 6A show simplified top plan and cross-sectional views taken along line A-A', respectively, of a conventional semiconductor wafer 600 having a photovoltaic region in the form of junction 601 between N-type silicon 602 and P-type silicon 604. Top surface 600a of wafer 600 bears broader conducting lines in the form of a pair of bus bars 604, and a plurality of narrower conducting lines 606 orthogonal to the bus bars. Conducting lines 604 and 606 are typically formed from a conducting materials such as Ag solder. The particular pattern of conducting lines 604 and 606 varies according to the manufacturer of the substrate, but these lines serve as a first electrode of the solar cell.

The cross-sectional view of FIG. 6A also shows the presence of conducting material 608 on the backside 600b of wafer 600. This backside conducting material 608 serves as a second electrode for the solar cell. Application of a bias potential between the first electrode (lines 604 and 606 on the wafer front side), and the second electrode (conducting material 608 present on the back side 600b of the wafer 600), allows a flow of electrons generated at junction 601 by incident light from source 650, to be collected as an output current.

Figure 7A:
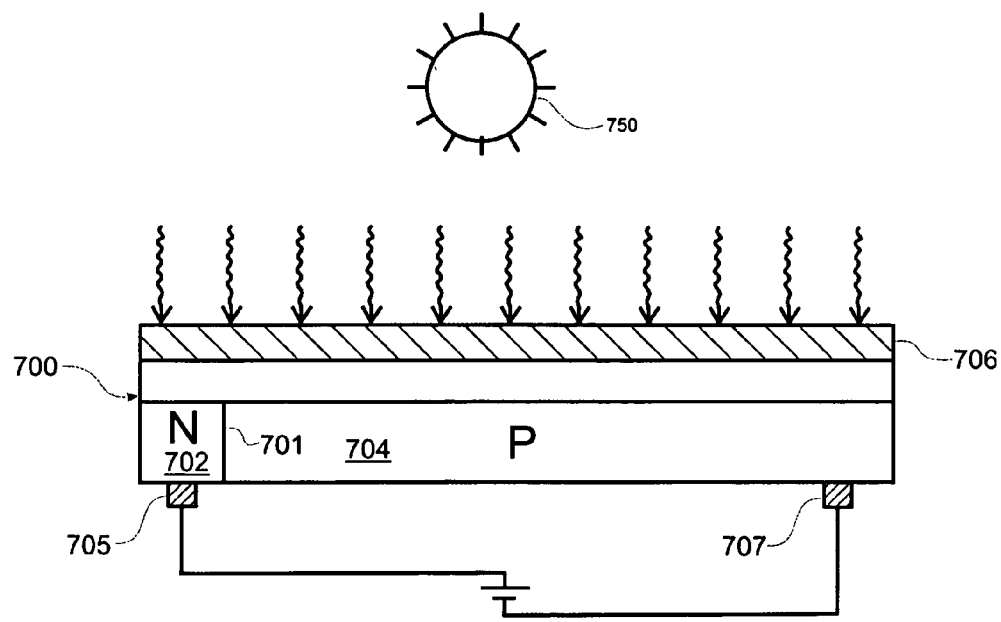
FIG. 7A is a simplified cross-sectional view of the conventional semiconductor wafer shown in FIG. 7.
Figure 7:
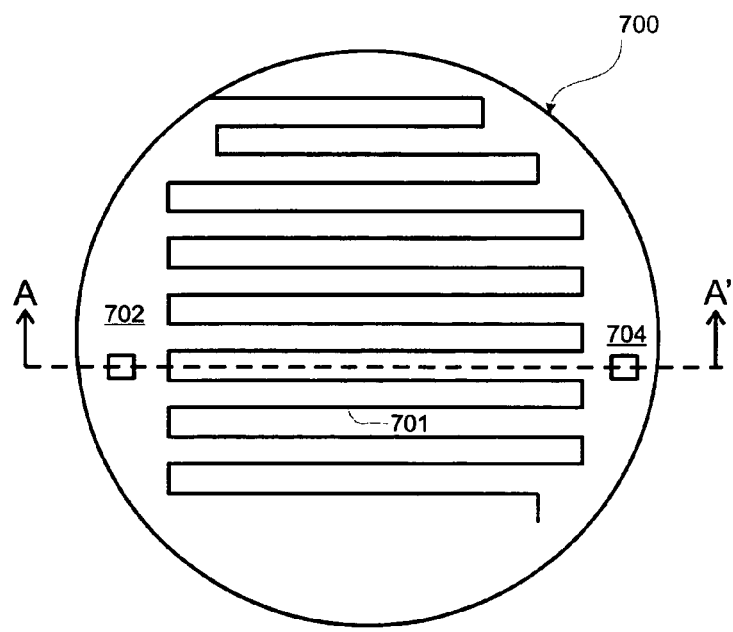
FIG. 7 is a simplified underside plan view of an alternative type of a conventional semiconductor wafer configured to generate electrical current in response to incident light.

FIGS. 7 and 7A show simplified top plan and cross-sectional views, respectively, of another type of conventional semiconductor wafer 700 having both the first and second electrodes 705 and 707 present on the same (back) side of the wafer. As shown in FIGS. 7-7A, wafer 700 bears an antireflective coating 706 on its front side. Anti-reflective coating 706 typically comprises silicon nitride that is formed by chemical vapor deposition. Anti-reflective coating 706 promotes absorption by the wafer of optical energy from source 750.

The photovoltaic region of the conventional semiconductor wafer of FIGS. 7 and 7A is in the form of junction 701 between N-type silicon regions 702 interdigitated with P-type silicon regions 704. This interdigitated arrangement of N- and P-type regions 702 and 704 may be created, for example, by masked ion implantation. First contact 705 is in electrical communication with N-type silicon region 702, and second contact 707 is in electrical communication with P-type silicon region 704. Application of a bias potential between first contact 705 and second contact 707 allows a flow of electrons generated at junction 701 by incident light from source 750, to be collected as an output current.

As described in detail above, the photovoltaic strips utilized in fabricating solar cells in accordance with embodiments of the present invention, are typically formed by physically separating portions of an existing semiconductor wafer, for example a conventional wafer having the structure shown in FIG. 6-6A or 7-7A. As is apparent from these Figures, however, the pattern of conducting and semiconducting material is different between these wafer designs.

Figure 8:
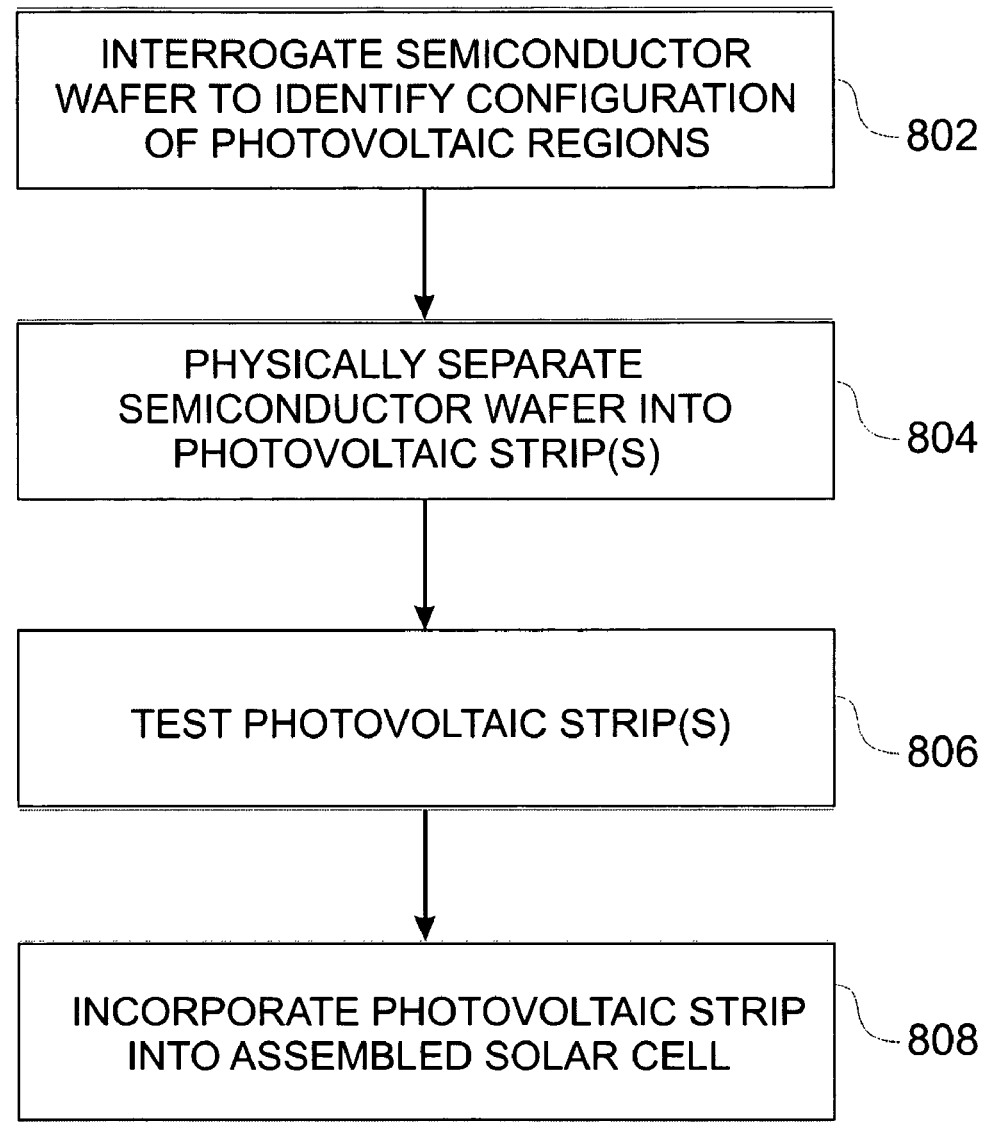
FIG. 8 is a simplified flow diagram illustrating steps of one embodiment of a method in accordance with the present invention for forming photovoltaic strips.

Therefore, as shown in the simplified flow chart of FIG. 8, a first step 802 of a method 800 in accordance with an embodiment of the present invention, causes a semiconductor wafer to be interrogated to identify the configuration of photovoltaic regions present therein. Such interrogation may take the form of one or more techniques, employed alone or in combination.

For example, the back side of a semiconductor wafer may be exposed to optical scanning, in order to identify features characteristic of a typical configuration of photovoltaic regions. Thus in relation to the specific convention semiconductor wafer designs described above, such back side optical scanning would allow a user to rapidly and reliably distinguish the presence of the interdigitated conducting lines characteristic of the semiconductor wafer design of FIGS. 7-7A.

Alternatively or in combination with the optical scanning technique just described, the configuration of photovoltaic regions of a semiconductor wafer may determined through electrical techniques. In one particular embodiment, a front side of a semiconductor wafer could be illuminated with light, and the location of voltages/currents on the back side of the wafer detected. The location of such voltages/currents would reveal the arrangement of conducting lines present on the back side of the wafer, again rapidly and reliably allowing conventional wafers of the first type (FIGS. 6-6A) to be distinguished from wafers of the second type (FIGS. 7-7A).

Still further alternatively, the configuration of photovoltaic regions of a semiconductor wafer my be determined by thermal techniques. In one particular embodiment, the location of contacts on the wafer could first be identified, and then a potential difference of known magnitude intentionally applied across these contacts. The resulting ohmic heating of conducting elements on the wafer could be thermally detected and mapped to reveal the characteristic configuration of photovoltaic regions on the wafer.

Figure 9:
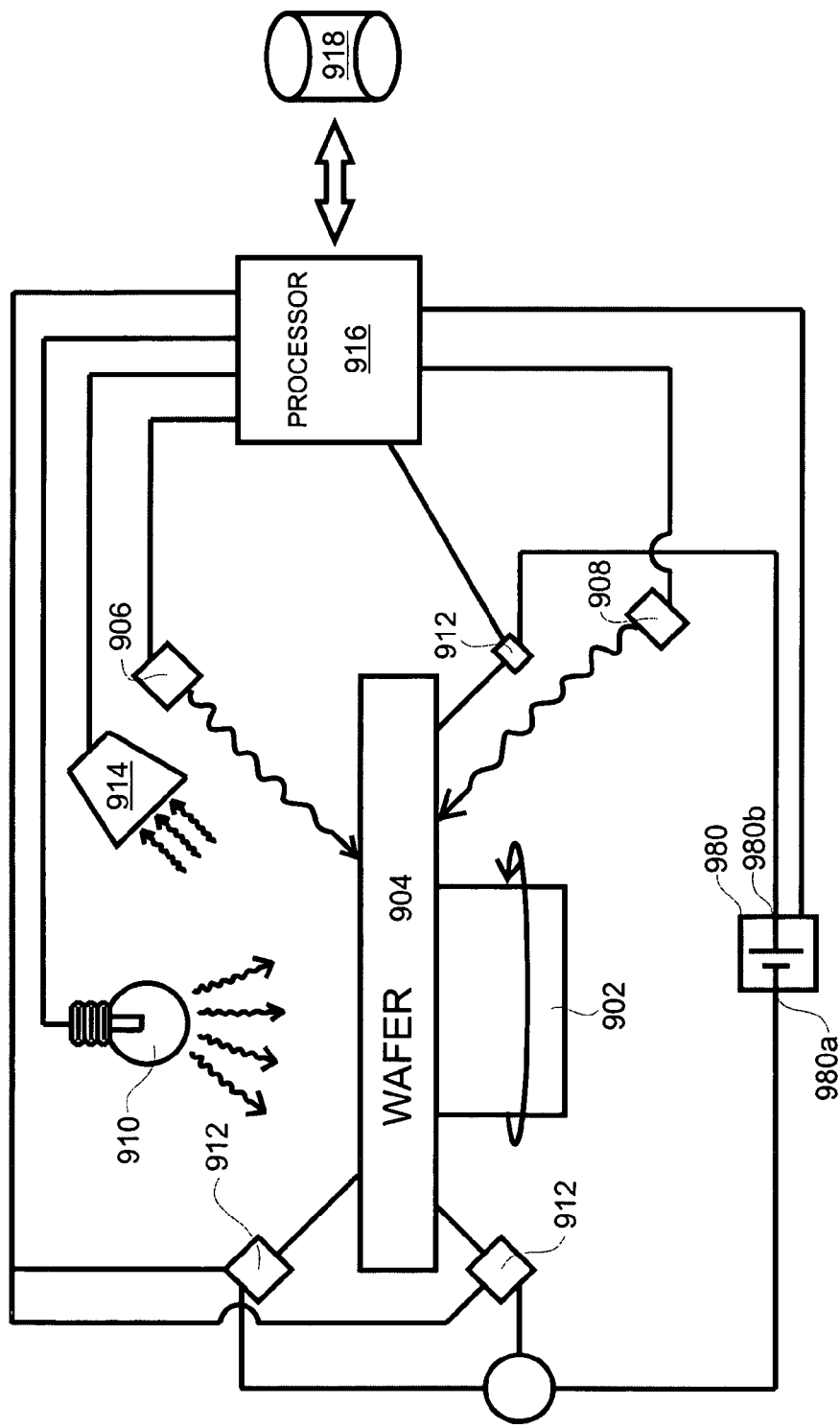
FIG. 9 shows a simplified perspective view of an embodiment of an apparatus for identifying semiconductor wafer type.

FIG. 9 shows a simplified schematic diagram of an apparatus for identifying a type of semiconductor wafer. Apparatus 900 includes rotatable support 902 that is configured to support wafer 904. Optical scanner devices 906 and 908 are configured to illuminate the top and bottom surfaces, respectively, of supported wafer 904. Based upon this optical interrogation, the nature of the semiconductor wafer can be determined.

Apparatus 900 of FIG. 9 also includes light source 910 that is configured to illuminate the front side of the substrate with radiation of a plurality of wavelengths, mimicking sunlight incident to the solar cell in order to provoke electrical output from the wafer. Apparatus 900 further includes conducting pins 912 that can be configured to detect current/voltage generated the front and back surfaces of the wafer in response to light received from source 910. The location and character of electrical activity in the form of current/voltages detected by pins 912 on one or both surfaces of the substrate, can be analyzed to reveal the type of semiconductor wafer.

Apparatus 900 of FIG. 9 also includes a radiation detector 914 that is configured to detect infrared or other radiation emitted from the substrate. Specifically, application of a potential difference by pins 912 in communication with terminals 980a-b of power supply 980, across contacts located on the wafer back side and/or wafer front side, may result in ohmic heating of conductive elements present on the wafer. Radiation detector 914 may be configured to sense the location/intensity of infrared emissions from the wafer that are characteristic of such heating, allowing corresponding identification of the wafer type.

As indicated in FIG. 9, pins 912, source 910, detector 914, and scanners 906 and 908 are all in selective electronic communication with processor 916. Processor 916 is configured to operate these various elements to interrogate the wafer. Processor 916 may also be configured to reference database 918 containing stored attributes representative of different wafer types.

Once the identity of the semiconductor wafer has been identified utilizing one or more of the above-referenced techniques, this information may be communicated to configure an apparatus to physically separate the semiconductor wafer into one or more photovoltaic strips, as shown in second step 804 of method 800 of FIG. 8. Specifically, the apparatus for physically separating the wafer into strips may be in knowledge communication with the apparatus utilized to identify the substrate type. On the basis of information received from the wafer identification apparatus, the wafer apparatus is configured to select specific locations of lines at which the wafer/substrate is optimally separated into individual photovoltaic strips. For example, as described below, receipt of information indicating a substrate has electrical contacts exclusively on its back side, may indicate that physical separation is best achieved by sawing through a front side of the substrate.

Physical separation of the wafer into photovoltaic strips in accordance with embodiments of the present invention can be achieved utilizing a number of different techniques, employed alone or in combination. In accordance with one embodiment of the present invention, this physical separation of the semiconductor wafer into strips may be accomplished by physical sawing. Conventionally, cutting or sawing a silicon wafer is performed in the semiconductor industry to separate a wafer into individual die. Typically in such a conventional sawing process, the silicon wafers are designed with pre-determined scribe streets. The kerf width (cut area) will normally have rugged, rough, and uneven edges, and most of the material along the width of the street will be cut and removed without any negative impact to the performance of the semiconductor device.

In a photovoltaic cell application, however, such a rough, uneven, and rugged cut may give rise to an edge effect which undesirably lowers the efficiency of the device. Specifically, roughness at the edge of a sawn strip may promote recombination of hole-electron pairs, rather than the separation of such pairs which leads to the generation of current.

Moreover, as indicated above many solar cell wafer designs are not pre-designed to be cut/sawed or scribed. Finding the "sweet-spot" or the correct or optimum location for a cut between strips, is vital to minimize or prevent loss in efficiency rate or maximize current voltage curve (IV curve) performance. Of course, one of ordinary skill in the art would recognize other variations, modifications, and alternatives.

Figure 7B:
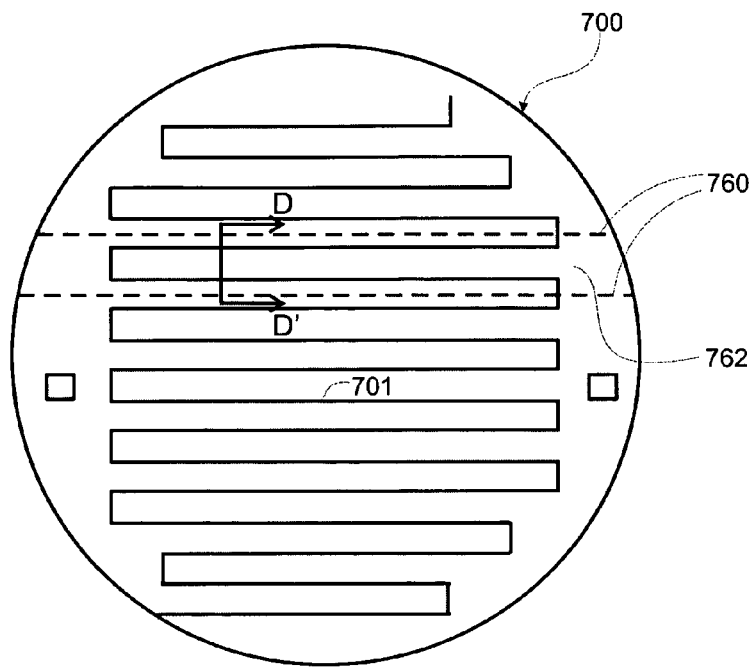
FIG. 7B is a simplified underside plan view of the conventional semiconductor wafer of FIG. 7, showing the location of a photovoltaic strip.
Figure 7C:
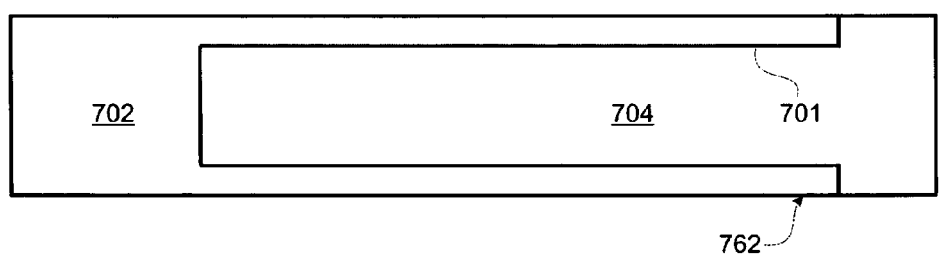
FIG. 7C is a simplified enlarged view of a photovoltaic strip.

For example, FIG. 7B again shows a plan underside view of the back side of a conventional semiconductor wafer 700 of FIGS. 7-7A. Dashed line 760 shows the outline of a photovoltaic strip 762 that is to be prepared from wafer 700. FIG. 7C shows an enlarged view of this photovoltaic strip 762, which comprises P-type region 704 flanked by adjacent N-type regions 702. In order to maintain optimum efficiency of the photovoltaic strip, strip 762 is cut in order to maintain the same ratio of area of P- and N-type regions present on the original substrate. Therefore, exact positioning of the location of physical separation of adjacent strips is of paramount concern.

Accordingly, in one embodiment of a method in accordance with the present invention, photovoltaic strips having very clean, even and kerf free edges were fabricated with a saw equipped with a very thin diamond blade. In accordance with one particular embodiment, the saw having a blade width equal or less than 0.001" was used to separate photovoltaic strips with less than a 0.001" scribe width, thereby reducing to the greatest extent possible the amount of silicon area cut away and lost during solar cell fabrication. The saw speed was set at 1"-3"/sec, and a spray of deionized water was focused directly on the blade during sawing. After sawing, the wafer is washed and cleaned using a high pressure wash and spin dryer system to remove silicon dust and other loose foreign materials.

In order to minimize cell area lost during a cutting process, it is important to minimize the amount of silicon that is cut away. However, as shown and described above in connection with FIGS. 7-7A, with backside-only contact photovoltaic semiconductor wafers, conducting material is present on only one (the back) side of the wafer, and the front side of the photovoltaic element is normally uniformly blue in color. This makes the precise physical separation of photovoltaic strips extremely difficult to achieve by sawing the wafer from the front side.

Despite this, in accordance with other embodiments of the present invention, a clean, even edge cut in a photovoltaic cell having back side contacts, is achieved by cutting/sawing on the front side of the semiconductor wafer, rather than on the back side bearing electrically conducting lines. This cutting of the front side of the wafer avoids loading the saw blade with cut metal debris, that can result in a rough, uneven cut, and short blade life.

In such embodiments, accurate positioning of the saw blade is achieved based upon the prior, wafer identification step. Specifically, once a wafer type has been recognized, the location of conducting and other elements on the wafer backside can be known with a high degree of specificity, allowing cutting to occur from the featureless front-side of the wafer.

Other embodiments in accordance with the present invention may utilize the above-referenced techniques in combination, for example etching with a small diamond blade the front side of a substrate having only back side contacts.

Various different kinds of apparatuses my be utilized for sawing. One apparatus may utilize a single saw blade whose positioning is determined by a microprocessor based upon information regarding wafer type obtained from the interrogation. Other apparatuses may employ a gang of spaced apart blades operating at the same time in order to accomplish physical separation of multiple strips.

Moreover, still other embodiments in accordance with the present invention may utilize techniques other than sawing, for physical separation of a substrate into strips. For example, turning again to the conventional wafer having only back side contacts that is shown in FIG. 7A, junction 701 between N- and P-type regions does not extend through the entire thickness of the silicon.

Figure 7D:
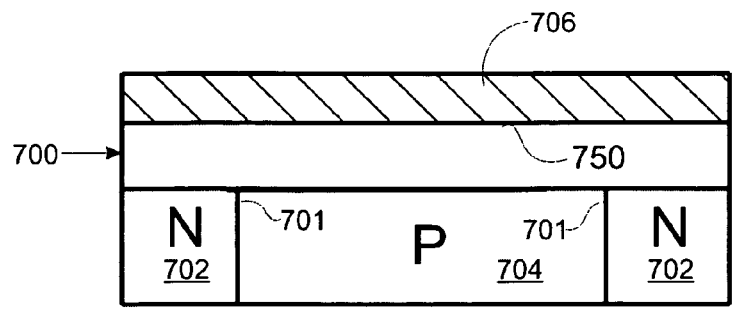
FIG. 7D is a simplified cross-sectional view of the conventional semiconductor wafer of FIG. 7B, taken along line D-D'.
Figure 7E:
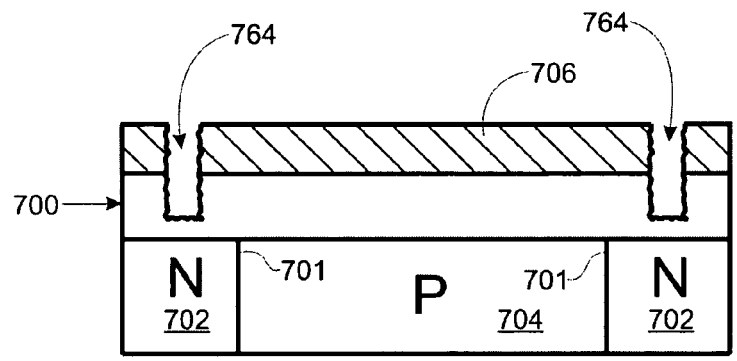
FIG. 7E is a simplified cross-sectional view of the conventional semiconductor wafer of FIG. 7B, showing partial sawing from the front side of the wafer.
Figure 7F:
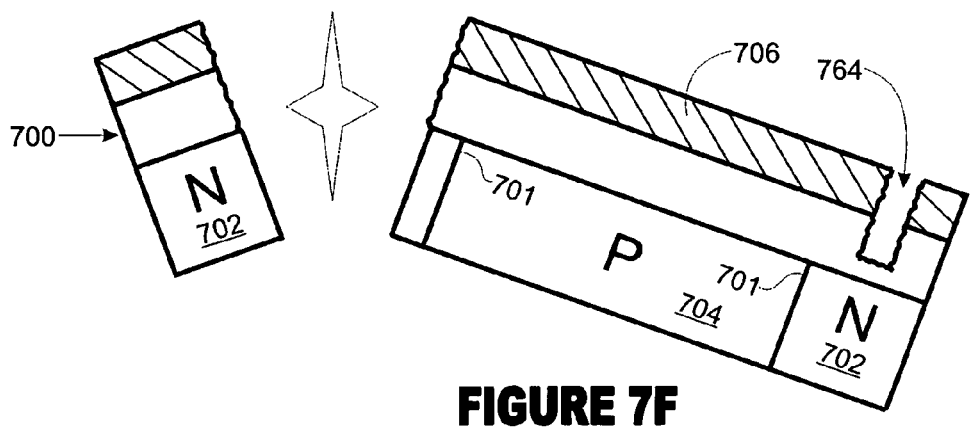
FIG. 7F is a simplified cross-sectional view of the conventional semiconductor wafer of FIG. 7E, showing completion of physical separation of an edge of the photovoltaic strip by fracturing along an axis of the unit cell.

Therefore, in accordance with an alternative embodiment of the present invention, an initial saw cut through only a portion of the substrate to form a scribe line, may be followed by fracturing along this scribe line to complete physical separation of the strips. This is shown in FIGS. 7D-F. FIG. 7D shows a simplified cross-sectional view of the wafer taken along line D-D' of FIG. 7B, showing a portion of the wafer containing the strip that is to be physically separated therefrom. FIG. 7E shows that in a first strip separation step, wafer 700 is sawn from the front side only partially through the thickness of the substrate, halting just prior to entering the doped region. Having created scribe lines 764 by sawing to define adjacent photovoltaic strips, in the second step separation step shown in FIG. 7F, physical separation between the strips could then be completed by snapping the wafer along these scribe lines, which are positioned to correspond with axes of unit cells of the crystal lattice. Fracture along such axes of the unit cell results in an extremely smooth and even break, with minimal edge loss effect.

Still other techniques may alternatively be employed to form the photovoltaic strips from the wafer. In accordance with one such alternative embodiment, masking and etching techniques may be used to define and expose inter-strip regions to plasma etching conditions resulting in removal of material. Again, identification of semiconductor substrate type and the location of corresponding conducting regions would be important to determine the optimal location of the patterned mask. And as described above, such etching could be utilized in combination with stress-induced fracture along the axes of the unit cell, to achieve strip edges that are extremely even and smooth.

Once individual photovoltaic strips have been created from a semiconductor wafer according to embodiments of the present invention, in accordance with step 806 of method 800 or FIG. 8, each photovoltaic strip may be electrically tested to initially determine its electrical performance. Based on this testing, electrical characteristics such as the current/voltage curve (IV-curve), short-circuit current (Isc), open circuit voltage (Voc), efficiency, and fill factor can be determined. Such testing of the photovoltaic strips is helpful in order to allow them to be evaluated prior to the laborious and time-consuming step of incorporating them into the assembled solar cell.

FIG. 10 shows a simplified perspective view of an example of a jig for use in testing the electrical properties of photovoltaic strips. Jig 1000 comprises body 1002 having upper surface 1002a. Clamp(s) 1004 are configured to physically secure the photovoltaic strip 1006 in place on surface 1002a of jig 1000.

In particular, upper surface 1002a of testing jig 1000 also bears spaced-apart test contacts 1008a and 1008b that are in electrical communication with opposite poles 1010a and 1010b, respectively, of variable power supply 1012. Application of a potential bias across different portions of the photovoltaic strip 1006 through contacts 1008a and 1008b allows investigation of different electrical properties of the strip. For example, electrical characteristics such as current/voltage curve (IV-curve), short-circuit current (Isc), and open circuit voltage (Voc) can be determined by applying a potential across contacts 1008a-b.

In a final step 808 of method 800 shown in FIG. 8, the photovoltaic strip that has been formed, is incorporated into a solar cell design as described above. In accordance with one particular embodiment, the photovoltaic strip is coupled with a concentrator element utilizing an elastomer encapsulant.

Many benefits are achieved by way of the present invention over conventional techniques. For example, the present technique provides an easy to use process that relies upon conventional technology such as silicon materials, although other materials can also be used. Additionally, the method provides a process that is compatible with conventional process technology without substantial modifications to conventional equipment and processes. Furthermore, embodiments in accordance with the present invention are flexible, in that they allow semiconductor wafers from a plurality of different suppliers to be used to form the photovoltaic strips.

In general, embodiments in accordance with the present invention provide for an improved solar cell, which is less costly and easy to handle. Such solar cell uses a plurality of photovoltaic regions, which are coupled to concentrating elements according to a preferred embodiment. In a preferred embodiment, the invention provides a method and completed solar cell structure using a plurality of photovoltaic strips free and clear from a module or panel assembly, which are provided during a later assembly process. Also in a preferred embodiment, one or more of the solar cells have less silicon per area (e.g., 80% or less, 50% or less) than conventional solar cells. In preferred embodiments, the present method and cell structures are also light weight and not detrimental to building structures and the like. That is, the weight is about the same or slightly more than conventional solar cells at a module level according to a specific embodiment. In a preferred embodiment, the present solar cell using the plurality of photovoltaic strips can be used as a "drop in" replacement of conventional solar cell structures. As a drop in replacement, the present solar cell can be used with conventional solar cell technologies for efficient implementation according to a preferred embodiment. In a preferred embodiment, the present invention provides a resulting structure that is reliable and can withstand environmental conditions overtime. Depending upon the embodiment, one or more of these benefits may be achieved.

Although the above has been described in terms of a specific cutting technique, there can be other variations, modifications, and alternatives. For example, the cutting technique can be laser cut, water jet cut, high water jet pressure cut, scribe and break, chemical etch, including reactive ion etch, ion milling, any combination of these, and the like. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating a solar cell comprising:
   interrogating a semiconductor substrate with a combination of optical, thermal, and electrical techniques to detect at least one characteristic of the substrate;
   comparing the characteristic to information stored in a database regarding a plurality of substrate types, in order to determine a type of the substrate; and
   physically separating the semiconductor substrate into one or more photovoltaic strips based upon the substrate type determined,
   wherein the thermal interrogation comprises:
      applying a potential difference across contacts on the substrate; and
      detecting resulting ohmic heating of conducting elements.

2. The method of claim 1 wherein the optical interrogation comprises scanning a wafer surface to identify a pattern of conducting lines present thereon.

3. The method of claim 1 wherein the electrical interrogation comprises illuminating a front side of the wafer and detecting at least one of electrical currents and voltages on one surface of the substrate.

4. The method of claim 1 further comprising incorporating the photovoltaic strip into an assembled solar cell.

* * * * *